(12) United States Patent
Park

(10) Patent No.: US 7,319,617 B2
(45) Date of Patent: Jan. 15, 2008

(54) SMALL SECTOR FLOATING GATE FLASH MEMORY

(75) Inventor: Eungjoon Park, Fremont, CA (US)

(73) Assignee: Winbond Electronics Corporation (CN)

(*) Notice: Subject to any disclaimer, the term of this patent is extended or adjusted under 35 U.S.C. 154(b) by 180 days.

(21) Appl. No.: 11/129,646

(22) Filed: May 13, 2005

(65) Prior Publication Data

US 2006/0256606 A1 Nov. 16, 2006

(51) Int. Cl.
*G11C 16/06* (2006.01)

(52) U.S. Cl. .............................. 365/185.25; 365/185.11; 365/185.02

(58) Field of Classification Search ........... 365/185.25, 365/185.11, 185.02
See application file for complete search history.

(56) References Cited

U.S. PATENT DOCUMENTS

| | | | |
|---|---|---|---|
| 6,005,810 A | 12/1999 | Wu | |
| 6,166,959 A | 12/2000 | Gupta et al. | |
| 6,240,032 B1* | 5/2001 | Fukumoto | 365/222 |
| 6,668,303 B2 | 12/2003 | Pio | |
| 6,768,671 B1 | 7/2004 | Lee et al. | |
| 6,775,184 B1 | 8/2004 | Park et al. | |

* cited by examiner

*Primary Examiner*—Huan Hoang
(74) *Attorney, Agent, or Firm*—Cry & assocaites, P.A.

(57) ABSTRACT

To control the problem of program and erase disturb in flash memory arrays having multiple sectors of cells grouped in each isolation wells of the flash memory array, a refresh procedure is used that involves two readings of each of the cells in a "refresh area" of a group under different read timing conditions, with other read conditions being constant or varied as desired. Cells that yield the same result in both reads are not excessively disturbed and need not be reprogrammed. However, cells that read differently may be excessively disturbed and should be reprogrammed. The refresh procedure is particularly suitable for memory arrays with small sector size and many sectors per group. The memory arrays preferably incorporate memory cells that use hot electron programming and Fowler-Nordheim erase.

22 Claims, 14 Drawing Sheets

| REFRESH CONDITIONS ||||| 
|---|---|---|---|---|
| VOLTAGE | TIME | PROG CELL UNDISTURBED (HIGH VT) | PROG CELL SOMEWHAT DISTURBED (HIGH-MED VT) | PROG CELL EXCESSIVELY DISTURBED (LOW-MED VT) |
| NORMAL | NORMAL | 0 | 0 | 1 |
| NORMAL | RELAXED | 0 | 0 | 0 |
| ALTERED | RELAXED | 0 | 0 | 0 |
| NORMAL | ACCEL | 0 | 1 | 1 |
| ALTERED | ACCEL | 0 | 1 | 1 |

FIG. 2

SMALL SECTOR FLOATING GATE FLASH MEMORY

BACKGROUND OF THE INVENTION

1. Field of the Invention

The present invention relates to flash semiconductor memory, and more particularly to small sector floating gate flash memory having hot electron programming and Fowler-Nordheim erase.

2. Description of the Related Art

One common type of floating gate flash memory uses channel hot electron ("CHE") injection for programming the floating gate memory cells, and Fowler-Nordheim ("FN") tunneling for erasing the memory cells. Because of small cell size, fast read speed, and good program/erase endurance, floating gate type flash memory is widely used for code storage applications in mobile devices, PC BIOS, and many consumer devices. Floating gate flash memories typically have large sector sizes. FIG. 1 shows an illustrative 4M bit flash memory array that is organized into 2048 programmable pages of 256-bytes each. The pages are grouped into 8 erasable sectors of 256 pages each. The sector size therefore is 64 Kbytes.

Another common type of memory is the split gate flash memory. Split gate flash memory tends to be well suited to data storage because its erasable sectors are small, and many data storage applications involve the transfer of small amounts of bytes. The split-gate flash memory may be designed with a sector size for the Erase operation that is much smaller than that typically used for the floating gate flash memory. A typical sector for split gate flash memory ranges from about 4K bytes to about 256 bytes, compared to 64K bytes for floating gate flash memory.

The reason for the relatively large sector size in floating gate flash memory has to do with the need for sector isolation. In conventional floating gate flash memory, the cells in the same sector typically are deployed in the same P-well and are isolated from cells of other sectors by sector select transistors. The overhead imposed by separate P-wells and the use of respective groups of select transistors for the sectors can result in a big die size penalty if small sectors are implemented. For a 4M-bit flash memory array, for example, the overhead is on the order of a one percent increase in die size to implement one P well separation and sufficient sector select transistors to create the sector. Compared to a bulk mode flash memory in which all cells of the array are erased together, a 4 M-bit flash memory having large P-wells respectively containing sectors of 64 Kbytes has an 8% die size penalty, while the same size flash memory having more small P-wells respectively containing sectors of 4 Kbytes has a 108% die size penalty.

If multiple sectors of cells are deployed within a single P-well without any supplemental P-well isolation structures, the die size penalty is reduced. However, when multiple sectors are created within a particular P-well, and as cells in the particular P-well are programmed or erased by selecting various rows and sectors of cells in the particular P-well over time, the cells in the particular P-well that are not frequently selected suffer from programming disturb and erase disturb. In view of the importance of minimizing the die size penalty, techniques have been developed which allow cells to be disturbed but which correct the disturbed cells by refreshing or reprogramming them.

One refresh procedure for correcting disturb conditions is disclosed in U.S. Pat. No. 6,166,959, issued Dec. 26, 2000 to Gupta et al. This refresh procedure involves uploading the contents of a Refresh area to an internal RAM, and then downloading the data back to the Refresh area. Specifically, an internal refresh periodically rewrites the information stored in each of the rows of memory cells in a flash memory. The flash memory array includes a refresh pointer bitline that indicates the row to be refreshed. In a first embodiment, the internal refresh is performed automatically after every user erase/program cycle. In second and third embodiments, the user of the of the flash memory array selects when the internal refresh is performed, but the address of the row to be refreshed is supplied internally. In each of the three the embodiments, the internal refresh includes the four operations of Scan, Refresh Erase, Refresh Program, and Increment. Disadvantageously, the internal RAM imposes an overhead expense, and the refresh time tends to be long because of the large number of cells in the Refresh area that are refreshed.

Another refresh procedure for correcting disturb conditions is disclosed in U.S. Pat. No. 6,005,810, issued Dec. 21, 1999 to Wu. A byte-programmable/byte-erasable flash memory system is provided with on-chip counters and secondary storage. The counters count the numbers of program/erase cycles and compare them with empirically pre-determined counter limits. When the program/erase count exceeds the counter limit, the data then carried in the system are temporarily transferred onto the secondary storage while the memory array is refreshed and the counters are reset.

Another refresh procedure for correcting disturb conditions is disclosed in U.S. Pat. No. 6,668,303, issued Dec. 23, 2003 to Pio. This refresh procedure involves detecting the memory cells within a sector whose datum has been partially lost, and reprogramming the datum in the detected cells. The process of detecting partial data loss involves reading the memory cells in the sector using two different read voltages, a standard read voltage and a margin read voltage. The standard reading tells whether the cell is erased or programmed. The margin read, which involves more critical sensing conditions, tells whether the programmed cell has lost enough charge so that it should be refresh. While total refresh time is improved over the time required by the refresh procedure of the '959 patent because only the cells which have lost significant charge must be reprogrammed, the refresh procedure has a number of other disadvantageous. In one implementation, the refresh time is lengthy because two read operation per cell must be performed in the refresh area with different bias conditions. While this problem is avoided in another implementation by the use of two sense amplifiers per bit, this doubling of the number of sense amplifiers increases both the die size and power overhead.

Since existing refresh procedures for floating gate flash memory have disadvantages, there is need for improved control of disturb conditions in floating gate flash memories having hot electron programming and Fowler-Nordheim erase.

BRIEF SUMMARY OF THE INVENTION

The present invention provides a technique for controlling disturb conditions in floating gate flash memories so that a smaller sector size may be achieved without sacrificing original benefits of this technology. The smaller sector size allows the floating gate flash memory to be used for data storage applications, even those involving the programming and erasure of small amounts of data. The advantages of the floating gate flash memory for code applications need not be lost.

One embodiment of the present invention is a method of refreshing flash memory having a plurality of floating gate memory cells disposed in groups within respective isolation wells. The method comprises reading the memory cells within a refresh area of a selected one of the groups, wherein first read conditions are used to obtain respective first values, and second read conditions are used to obtain respective second values, and wherein the first and second read conditions respectively include different read timings; identifying memory cells from among the read memory cells of the reading step for which the respective first and second values in the reading step differ; and refreshing the identified memory cells.

Another embodiment of the present invention is a method of refreshing flash memory having a plurality of floating gate memory cells disposed in groups within respective isolation wells. The method comprises reading, in conjunction with an erase operation or a program operation on a selected set of memory cells in a selected one of the groups, at least some of the memory cells in the selected group other than or in addition to the memory cells in the selected set, wherein first read conditions are used to obtain respective first values, and second read conditions are used to obtain respective second values, and wherein the first and second read conditions respectively include different read timings; identifying memory cells from among the read memory cells of the reading step for which the respective first and second values differ; and refreshing the identified memory cells.

Another embodiment of the present invention is a method of refreshing flash memory having a plurality of floating gate memory cells disposed in groups within respective isolation wells. The method comprises selecting one of the groups for refresh; reading at least some of the memory cells in the selected group, including memory cells in the selected group exposed to erase-program disturb, using first read conditions to obtain respective first values, and second read conditions to obtain respective second values, the first and second read conditions respectively including different read timings; identifying memory cells from among the read memory cells of the reading step for which the respective first and second values in the reading step differ; and refreshing the identified memory cells.

Another embodiment of the present invention is a method of refreshing flash memory having a plurality of floating gate memory cells disposed in groups within respective isolation wells, comprising performing a data change operation on the memory; performing a disturb detection operation on the memory following the data change operation; repeating the data change operation and the disturb detection operation until disturbed memory cells are identified; and refreshing the disturbed memory cells. Each of the data change operations is performed on a selected sector of memory cells within a selected one of the groups, all other sectors of the selected group being unselected and the memory cells therein being susceptible to erase-program disturb. Moreover, each of the disturb detection operations comprises reading the memory cells in the non-selected sectors of the selected group using normal read timing to obtain respective first values, and looser read timing to obtain respective second values; and identifying the disturbed memory cells from among the read memory cells of the reading step when the respective first and second values in the reading step differ.

Another embodiment of the present invention is a flash memory device comprising a flash memory array having a plurality of row lines, column lines, and floating gate memory cells, the memory cells being coupled to the row lines and the column lines and disposed in groups within respective isolation wells of the array, each of the groups comprising a subset of the word lines; a row decoder coupled to the word lines; a column decoder coupled to the bit lines, the column decoder including a plurality of sense amplifiers; and command and control logic coupled to the row decoder and to the column decoder. The command and control logic comprises a comparator and is responsive to a data change command, following a data change operation on memory cells having one or more commonly-biased word lines in a selected one of the groups, reading at least some of the memory cells in the selected group having word lines other than or in addition to the one or more commonly-biased word lines, wherein the sense amplifiers are operable under first read conditions to obtain respective first values, and under second read conditions to obtain respective second values, and wherein the first and second read conditions respectively include different read timings; applying the first and second values to the comparators for identifying memory cells from among the read memory cells for which the respective first and second values in the reading step differ; and refreshing the identified memory cells.

Another embodiment of the present invention is a flash memory device comprising a flash memory array having a plurality of row lines, column lines, and floating gate memory cells, the memory cells being coupled to the row lines and the column lines and disposed in groups within respective isolation wells of the array, each of the groups comprising a subset of the word lines; a row decoder coupled to the word lines; a column decoder coupled to the bit lines, the column decoder including a plurality of sense amplifiers; and command and control logic coupled to the row decoder and to the column decoder. The command and control logic comprises a plurality of comparators and is responsive to an erase or program command for selecting one of the groups for refresh; reading at least some of the memory cells in the selected group, including memory cells in the selected group exposed to erase-program disturb, using first read conditions to obtain respective first values, and second read conditions to obtain respective second values, the first and second read conditions respectively including different read timings; applying the first and second values to the comparators for identifying memory cells from among the read memory cells for which the respective first and second values differ; and refreshing the identified memory cells.

Another embodiment of the present invention is a flash memory device comprising a flash memory array having a plurality of row lines, column lines, and floating gate memory cells, the memory cells being coupled to the row lines and the column lines and disposed in groups within respective isolation wells of the array, each of the groups comprising a subset of the word lines; a row decoder coupled to the word lines; a column decoder coupled to the bit lines, the column decoder including a plurality of sense amplifiers; and command and control logic coupled to the row decoder and to the column decoder. The command and control logic comprises a plurality of comparators and is responsive to an erase or program command for: performing a data change operation on the memory; performing a disturb detection operation on the memory immediately following the data change operation; repeating the data change operation and the disturb detection operation until disturbed memory cells are identified; and refreshing the disturbed memory cells. Each of the data change operations is performed on a respective selected sector of memory cells within a respective selected one of the groups, all other sectors of the selected group being unselected and the memory cells therein being susceptible to erase-program disturb; and wherein each of the disturb detection operations comprises reading only the memory cells in the respective non-selected sectors of the respective selected group using normal read timing to obtain respective first values, and altered read timing to obtain respective second values; and applying the first and second values to the comparators for identifying the disturbed memory cells from among the read memory cells of the reading step when the respective first and second values in the reading step differ.

Another embodiment of the present invention is a flash memory device comprising a flash memory array having a plurality of row lines, column lines, and floating gate memory cells programmed by hot electron injection and erased by Fowler-Nordheim tunneling, the memory cells being coupled to the row lines and the column lines and disposed in groups within respective isolation wells of the array, each of the groups comprising a subset of the word lines; a row decoder coupled to the word lines; a plurality of sense amplifiers respectively coupled to selected ones of the column lines; a plurality of first registers respectively coupled to the sense amplifiers; a plurality of second registers respectively coupled to the sense amplifiers; a plurality of comparators having first inputs respectively coupled to the first registers, and second inputs respectively coupled to the second registers; and a command and control logic circuit coupled to the first registers for latching the first registers with a normal timing, coupled to the second registers for latching the second registers with a loose timing, and coupled to the comparators for receiving an indication of disturbed memory cells.

Another embodiment of the present invention is a flash memory device comprising a flash memory array having a plurality of row lines, column lines, and floating gate memory cells programmed by hot electron injection and erased by Fowler-Nordheim tunneling, the memory cells being coupled to the row lines and the column lines and disposed in groups within respective isolation wells of the array, each of the groups comprising a subset of the word lines; a row decoder coupled to the word lines; a plurality of sense amplifiers respectively coupled in pairs to selected ones of the column lines; a plurality of delay elements respectively coupled to outputs of one of the sense amplifiers in each of the pairs of sense amplifiers, wherein each pair of sense amplifiers furnishes a delayed output and an non-delayed output; a plurality of comparators respectively coupled to the pairs of delay elements for respectively comparing the delayed outputs and the non-delayed outputs thereof; a plurality of latches respectively coupled to the comparators; and a command and control logic circuit coupled to a control input of the latch for latching an output of the comparator with a normal timing plus delay, and coupled to an output of the latch for receiving an indication of disturbed memory cells.

Another embodiment of the present invention is a flash memory device comprising a flash memory array having a plurality of row lines, column lines, and floating gate memory cells, the memory cells being coupled to the row lines and the column lines and disposed in groups within respective isolation wells of the array, each of the groups comprising a subset of the word lines; a row decoder coupled to the word lines; a column decoder coupled to the bit lines, the column decoder including a plurality of sense amplifiers; and command and control logic coupled to the row decoder and to the column decoder. The command and control logic comprises a plurality of comparators and is responsive to an erase or program command for reading, in conjunction with an erase operation or a program operation on a selected set of memory cells in a selected one of the groups, at least some of the memory cells in the selected group other than or in addition to the memory cells in the selected set, wherein first read conditions are used to obtain respective first values, and second read conditions are used to obtain respective second values, and wherein the first and second read conditions respectively include different read timings; applying the first and second values to the comparators to identify memory cells from among the read memory cells for which the respective first and second values differ; and refreshing the identified memory cells.

Another embodiment of the present invention is a flash memory device comprising an array of floating gate flash memory cells programmed by hot electron injection and erased by Fowler-Nordheim tunneling, the memory cells being disposed in a plurality of groups within respective isolation wells of the array; a row decoder coupled to the array; a column decoder coupled to the array, the column decoder comprising a disturb detection circuit; and a command and control logic circuit coupled to the disturb detection circuit. The command and control logic comprises means for reading memory cells in a refresh area of the array using first read conditions to obtain respective first values, and second read conditions to obtain respective second values, wherein the first and second read conditions respectively include different read timings; means for identifying memory cells from among the read memory cells for which the respective first and second values differ; and means for refreshing the identified memory cells.

Another embodiment of the present invention is a flash memory device comprising an array of floating gate flash memory cells programmed by hot electron injection and erased by Fowler-Nordheim tunneling, the memory cells being disposed in a plurality of groups within respective isolation wells of the array; a row decoder coupled to the array; a column decoder coupled to the array, the column decoder comprising a disturb detection circuit; and a command and control logic circuit coupled to the disturb detection circuit. The command and control logic circuit comprises means for performing an erase operation or an embedded erase-program operation of a selected sector of memory cells within a selected one of the groups, wherein at least some of the memory cells other than the cells subject to the erase-program operation are susceptible to erase-program disturb; means for reading memory cells in at least non-selected sectors of the selected group using first read conditions to obtain respective first values, and second read conditions to obtain respective second values, the first and second read conditions respectively including different read timings; means for identifying memory cells from among the read memory cells of the reading step for which the respective first and second values in the reading step differ; and means for refreshing the identified memory cells.

Another embodiment of the present invention is a flash memory device comprising an array of floating gate flash memory cells programmed by hot electron injection and erased by Fowler-Nordheim tunneling, the memory cells being disposed in a plurality of groups within respective isolation wells of the array; a row decoder coupled to the array; a column decoder coupled to the array, the column decoder comprising a disturb detection circuit; and a command and control logic circuit coupled to the disturb detection circuit. The command and control logic circuit comprises means for performing an erase operation or an embedded erase-program operation on the memory; means for performing a disturb detection operation on the memory following the embedded erase-program operation; means for repeating the erase operation or the embedded erase-program operation and the disturb detection operation until disturbed memory cells are identified; and means for refreshing the disturbed memory cells; wherein each of the erase-program operations is performed on a selected sector of memory cells within a selected one of the groups, all other sectors of the selected group being unselected and the memory cells therein being susceptible to erase-program disturb; and wherein each of the disturb detection operations comprises: reading the memory cells in at least the non-selected sectors of the selected group using normal read timing to obtain respective first values, and altered read timing to obtain respective second values; and identifying the disturbed memory cells from among the read memory cells of the reading step when the respective first and second values in the reading step differ.

BRIEF DESCRIPTION OF THE SEVERAL VIEWS OF THE DRAWINGS

FIG. 2 is a table of refresh conditions.

DETAILED DESCRIPTION OF THE INVENTION, INCLUDING THE BEST MODE

Figure 1:
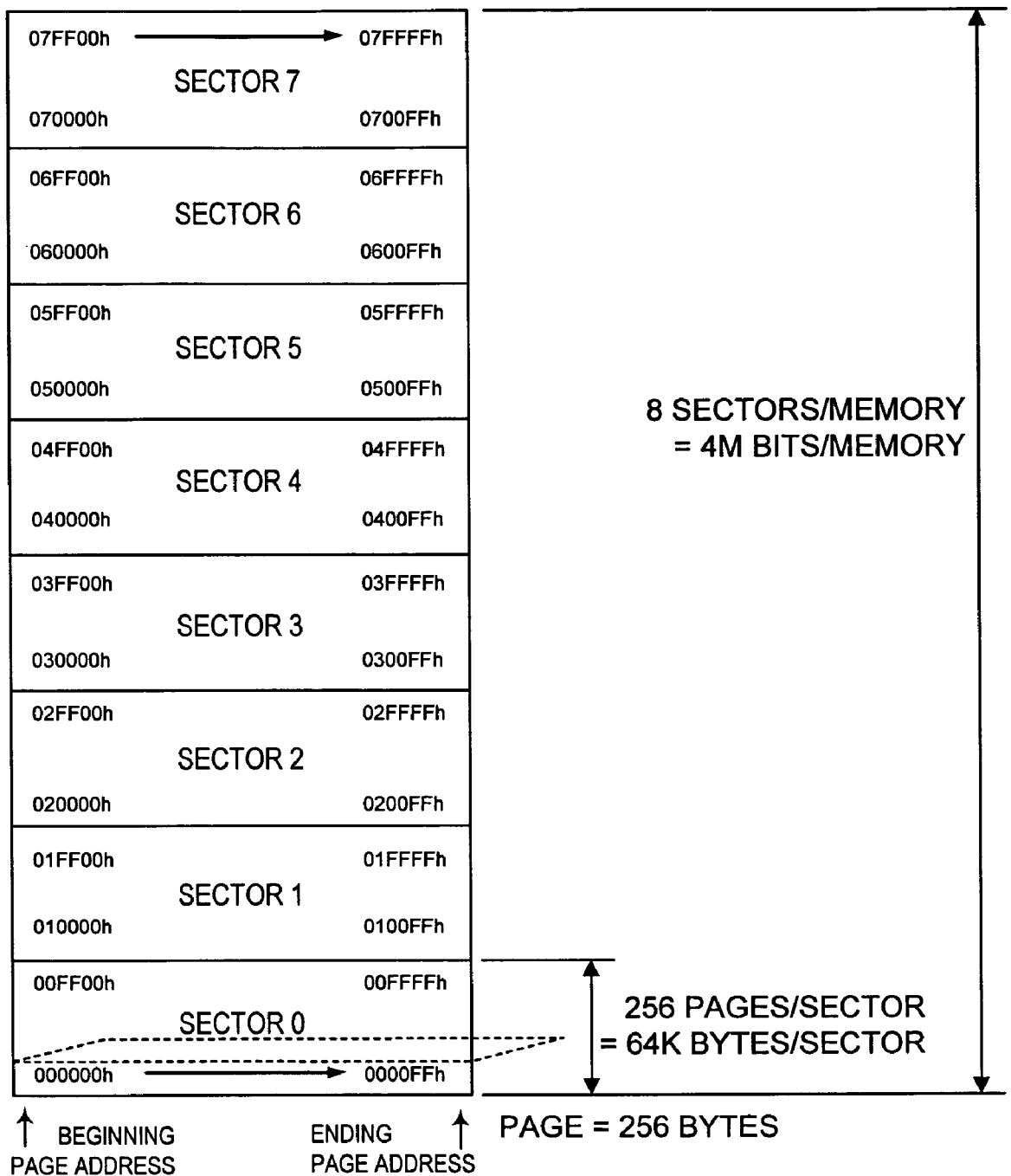
FIG. 1 is a schematic diagram of a prior art organization of a 4M-bit flash memory array.

To control the problem of program and erase disturb in flash memory arrays having multiple sectors of cells grouped in each isolated P-well, a refresh procedure is used that involves two readings of each of the cells in a "refresh area" of a group under different read timing conditions, with other read conditions being constant or varied as desired. Cells that yield the same result in both reads are not excessively disturbed and need not be reprogrammed. However, cells that read differently may be excessively disturbed and should be reprogrammed. The refresh procedure is particularly suitable for memory arrays with small sector size and many sectors per group. The memory arrays preferably incorporate memory cells that use hot electron programming and Fowler-Nordheim erase, and are arranged in a suitable flash architecture such as the well-known NOR common ground architecture or the well-known alternate metal virtual ground architecture. A suitable type of memory cell structure is the single transistor floating gate type, in which the floating gate is insulated from a channel by a tunnel oxide, and is overlaid by a control gate. A specific example of this type of cell structure is the well-known ETOX™ flash memory cell. The ETOX flash memory cell is suitable for use in the NOR common ground architecture, as is widely described in the literature, including various publications of Intel Corporation of Santa Clara, Calif., and which is available as a fabrication service from various semiconductor device manufacturers. Process for the virtual ground architecture are widely described in the literature and are available as fabrication services from various semiconductor device manufacturers, including National Semiconductor Corporation of Santa Clara, Calif., and Macronix International Co., Ltd. of Hsinchu, Taiwan.

Within each P-well or group of cells, multiple small sectors may be formed from subsets of the word lines in the group, so that each sector may contain the cells controlled by one or more word lines. If each word line controls 2048 cells, for example, then a small sector of 256 bytes may be formed by the cells of just one word line, while a larger but still relatively small sector of 4K-bytes may be formed by the cells of 16 word lines. A sector of cells may be erased to a low $V_T$ or "1" state by bringing their word line(s) to a potential that is highly negative with respect to the potential of the P-well. These cells are thereby erased to a low $V_T$ state by Fowler-Nordheim tunneling of electrons from the floating gates of the transistors to the substrate. One or more cells on a selected word line may be programmed to a high $V_T$ or "0" state by biasing their sources and drains so that hot electrons are generated in these cells, and by biasing their word line so that the hot electrons are attracted to the floating gate of the transistors. Illustratively, programming may be done by the page, byte or word. To avoid programming of other cells on the selected word line, one or both of their sources and drains may be floated. To avoid programming of cells on non-selected word lines, the non-selected word lines are biased to avoid attracting electrons. It will be appreciated that the particular convention of the "0" and "1" states set forth herein is illustrative, and other conventions may be used as appropriate.

The refresh procedure involves in effect two reads of cells in at least a "refresh area" under at least different read timing conditions. Preferably, one of the reads is a normal read, and the other is time-altered relative to the normal read. The refresh area may be considered to be the cells controlled by word lines within a group that were unselected during a sector erase operation or a programming operation. Alternatively, the refresh area may be considered to be all of the cells within a group, even though defining a refresh area in this manner would incur some unnecessary overhead due to inclusion of recently erased or programmed cells. One approach for performing the normal read and the time-altered read is to use just one sensing operation and two latching operations (each of which may be referred to as a "read") for each cell. Another approach for performing the normal read and the time-altered read is to use two separate sensing and latching operations, each of which may be referred to as a read. The two reads may be performed with some overlap in time, or over different time periods in any order desired. Generally, sensing may be dynamic or static.

The normal read involves reading cells in the refresh area, illustratively 8 or 16 cells at a time, under normal or substantially normal conditions of voltage and time. The time-altered read involves reading the same cells with a different read timing that is either slower than normal time (generally a looser read) or faster than normal time (generally a tighter read), and with or without changing other factors such as the read voltage on the word lines, the precharge voltage (if used) on the bit lines, or the reference current in the sense amplifiers. Cells that read as programmed or "0" for both reads are not excessively disturbed and need not be reprogrammed, and cells that read as erased or "1" for both reads are not susceptible to disturb. However, cells that do not read the same in the normal read and in the time-altered read are considered to be excessively disturbed and should be reprogrammed. These operations are repeated as necessary until all cells in the refresh area are checked and reprogrammed as necessary.

To better understand the problem of disturb, consider an illustrative set of program and erase conditions for floating gate flash memory cells within the same group, which are shown below in Table 1. Programming disturb is due to shared bit lines, which are the drains of the cells, and erase disturb is due to shared bulk.

TABLE 1

| Program conditions for cells in a selected sector of a selected group | |
|---|---|
| Drain | 6 V |
| Gate | 10 V |
| Source | 0 V |
| Bulk | 0 V |
| Program conditions for cells in unselected sectors of a selected group | |
| Drain | 6 V |
| Gate | 0 V |
| Source | 0 V |
| Bulk | 0 V |
| Erase conditions for cells in a selected sector of a selected group | |
| Drain | 8 V |
| Gate | (8 V) |
| Source | 8 V |
| Bulk | 8 V |
| Erase conditions for cells in unselected sectors of a selected group | |
| Drain | 8 V |
| Gate | 0 V |
| Source | 8 V |
| Bulk | 8 V |

Shift in the threshold voltage $V_T$ of cells in the unselected groups due to program disturb and erase disturb for the conditions of Table 1 are shown in Table 2. It is observed that only programmed cells were subjected to program and erase disturb, and the effect was that their threshold voltages $V_T$ were lowered. Therefore, it is sufficient if the program and erase algorithms, which preferably are embedded in the memory device, check the cells of the unselected sectors in the selected group, and reprogram only the programmed cells that suffer significant charge loss.

TABLE 2

| | Erased Cell | Programmed Cell |
|---|---|---|
| $V_T$ shift of cells in the unselected groups due to program disturb | | |
| 100 cumulative cycles | 0 V | 0 V |
| 1,000 cumulative cycles | 0 V | 0 V |
| 10,000 cumulative cycles | 0 V | 0.1 V |
| 100,000 cumulative cycles | 0 V | 0.4 V |
| 1,000,000 cumulative cycles | 0 V | 1.2 V |
| $V_T$ shift of cells in the unselected groups due to erase disturb | | |
| 100 cumulative cycles | 0 V | 0 V |
| 1,000 cumulative cycles | 0 V | 0 V |
| 10,000 cumulative cycles | 0 V | 0 V |
| 100,000 cumulative cycles | 0 V | 0.1 V |
| 1,000,000 cumulative cycles | 0 V | 0.4 V |

Various altered timing conditions for detecting programming and erase disturb are shown in the table of FIG. 2. An undisturbed programmed cell has a high threshold voltage $V_T$, and typically reads as "0" under normal conditions of read voltage and read time. As the cell becomes somewhat disturbed, its threshold voltage $V_T$ declines, but the cell still correctly reads as "0" under normal conditions of read voltage and read time. As the cell becomes excessively disturbed, its threshold voltage $V_T$ declines further, and the cell now reads as a "1" under normal conditions of read voltage and read time. To detect programming and erase disturb, the timing of the time-altered read is set so that the decreasing threshold voltage due to program and erase disturb eventually causes the normal read and the time-altered read to result in different values. The different values are detected, and the cell involved is reprogrammed to refresh the datum.

One approach is to detect a disturbed cell after it fails to correctly read under conditions of the normal read. In this approach, the normal read is done with normal timing and normal voltage, while the time-altered read of the same cell is done with a relaxed timing and normal voltage. However, more generally the conditions of timing and, if desired, the voltage may be altered as desired provided the conditions of one read are looser and the conditions of the other read are tighter, relative to one another. As shown in FIG. 2, a programmed cell that is undisturbed or only somewhat disturbed reads correctly as "0" in both the normal read and the relaxed read. However, as the cell continues to lose charge, it eventually is incorrectly read as a "1" in the normal read, even though it continues to be correctly read as a "0" in the relaxed read. This difference is detected and the cell is reprogrammed to correct the datum.

The type of refresh procedure that uses a relaxed read preferably is performed promptly after completing the embedded erase and programming of the selected sector of the selected group. This allows excessively disturbed cells to be detected and reprogrammed before any attempt is made to supply data from them. An advantage of using a relaxed read is that the number of program refresh operations is kept to a minimum, since a program refresh of a cell is done only when it is known that the cell cannot be read correctly in the normal read.

Figure 3:
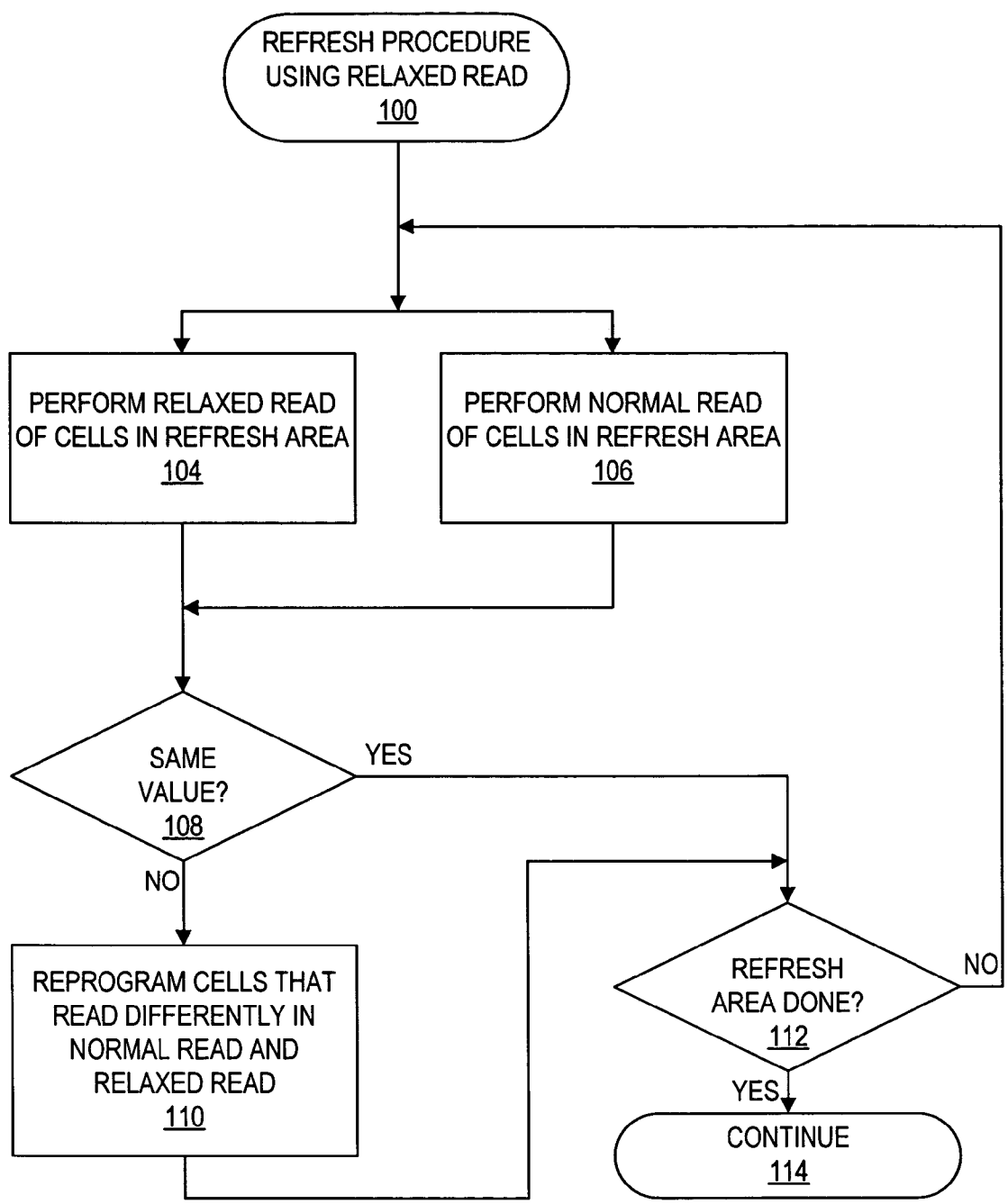
FIG. 3 is a flowchart of a refresh procedure using a relaxed read.

FIG. 3 is a flowchart that shows an illustrative refresh procedure 100 that uses a relaxed read. Two read operations are performed: a relaxed read of the cells in the refresh area (block 104) and a normal read of cells in the refresh area (block 106). The values read from each of the cells are compared (block 108). Cells that read differently in the normal read and the relaxed read are reprogrammed (block 110). The procedure continues with a determination of whether all cells in the refresh area have been checked (block 112). If all cells have not been checked (block 112—no), the procedure resumes with blocks 104 and 106. Otherwise (block 112—yes), the refresh procedure ends and other memory processes are continued (block 114).

Another approach is to detect a disturbed cell before it can be incorrectly read in a normal read. In this approach, the normal read is done with normal timing, while the time-altered read of the same cell is done with an accelerated timing. A normal voltage is used for both reads, although different voltages may be used if desired. As shown in FIG. 2, a programmed cell that is undisturbed reads correctly as "0" in both the normal read and the accelerated read. However, as the cell continues to lose charge, it eventually is incorrectly read as a "1" in the accelerated read, even though it continues to be correctly read as a "0" in the normal read. This difference is detected and the cell is reprogrammed to correct the datum. Advantageously, the accelerated read is faster that the normal read, thereby reducing overhead time.

Figure 4:
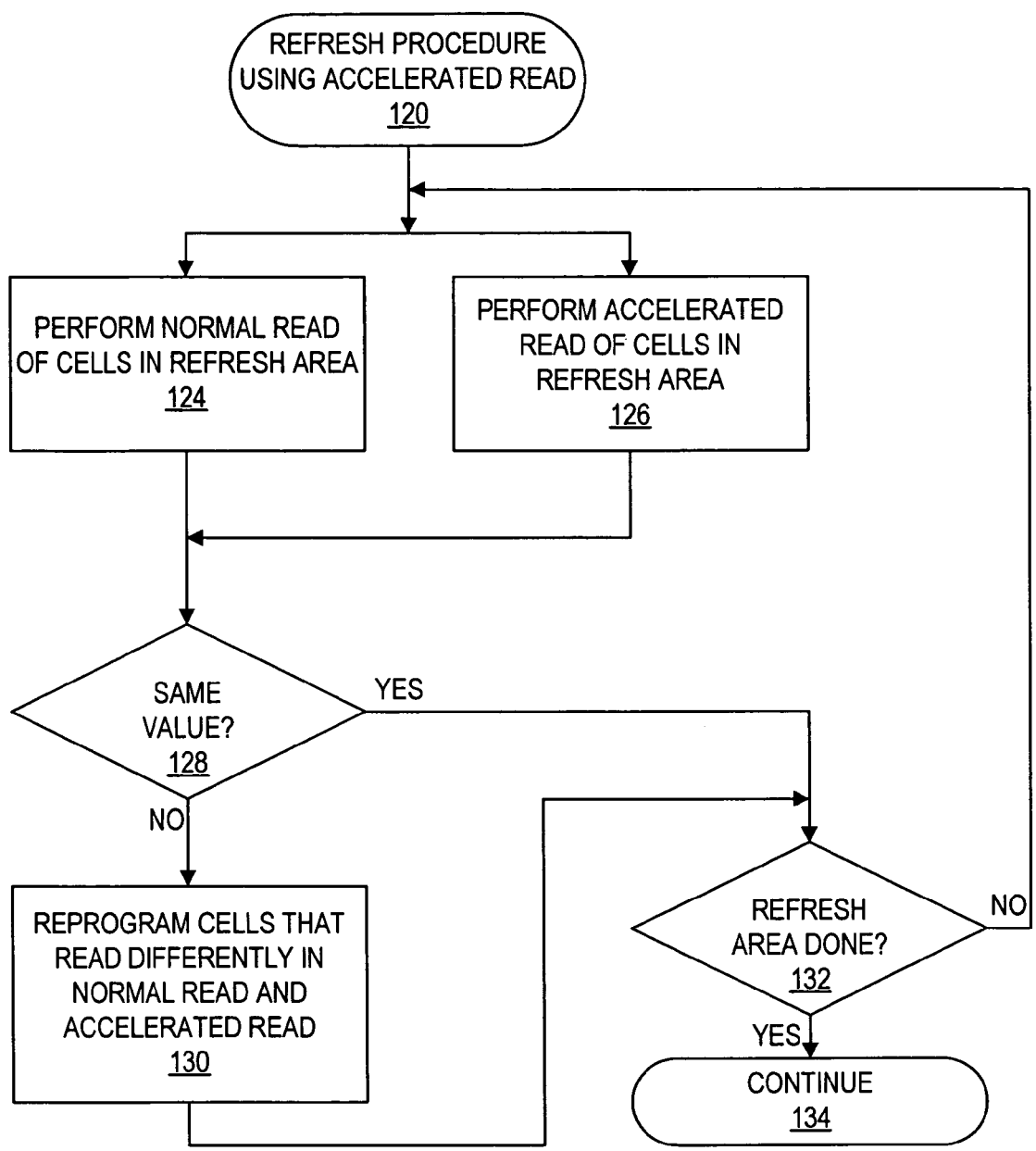
FIG. 4 is a flowchart of a refresh procedure using an accelerated read.

FIG. 4 is a flowchart that shows an illustrative refresh procedure 120 that uses an accelerated read. The procedure 120 includes a normal read of cells in the refresh area (block 124) and an accelerated read of the cells in the refresh area (block 126). The values read from the cells are compared (block 128). If the values are different, cells that read differently in the normal read and the accelerated read are reprogrammed (block 130). The procedure continues with a determination of whether all cells in the refresh area have been checked (block 132). If all cells have not been checked (block 132—no), the procedure resumes with block 124. Otherwise (block 132—yes), the refresh procedure ends and other memory processes are continued (block 134).

The timing for refresh procedures such as 100 and 120 relative to erasing, programming and reading is somewhat discretionary. The refresh procedure 100, for example, preferably is performed immediately following an erase operation, whether the erase operation is performed alone or as part of an embedded erase-program. However, refresh procedures may be performed after a program operation, or even at arbitrary times between memory access operations.

These novel refresh procedures refresh-cells in the refresh area with a minimum time overhead. Although read times vary considerably, a memory having a serial interface and specified at a clock rate of illustratively 50 MHz, for example, may perform a normal read in about 20 ns. Where a relaxed read is used in the refresh procedure, the relaxed read may be performed in about 24 ns. Where an accelerated read is used in the refresh procedure, the accelerated read may be performed in about 16 ns. Unless sequential reads are used, the total read time is just the longer of the two read times. Moreover, one or two sense amplifiers per bit may be used, depending on the implementation desired.

In addition, location dependence of the memory array is automatically optimized such that cells in areas with faster read speeds tend to have greater margins before being refreshed, while cells in areas with slower read speeds tends to have smaller margins before being refreshed. Therefore, uniform read speed across the whole memory array is achieved. This is because if all the cells have same cell current, those located far from the decoder in the word line tends to be read slower and those close to the decoder tends to be read faster due to word line RC delay. Therefore, cells far from the decoder recognized with smaller cell current than those close to the decoder. If these cells lose charge with equal speed, the cells far from the decoder need to be refreshed less often than those close to the decoder. As a result, the cell current between the cells along the same word line tends to be different, but the read speed for each of them tends to be same.

Figure 5:
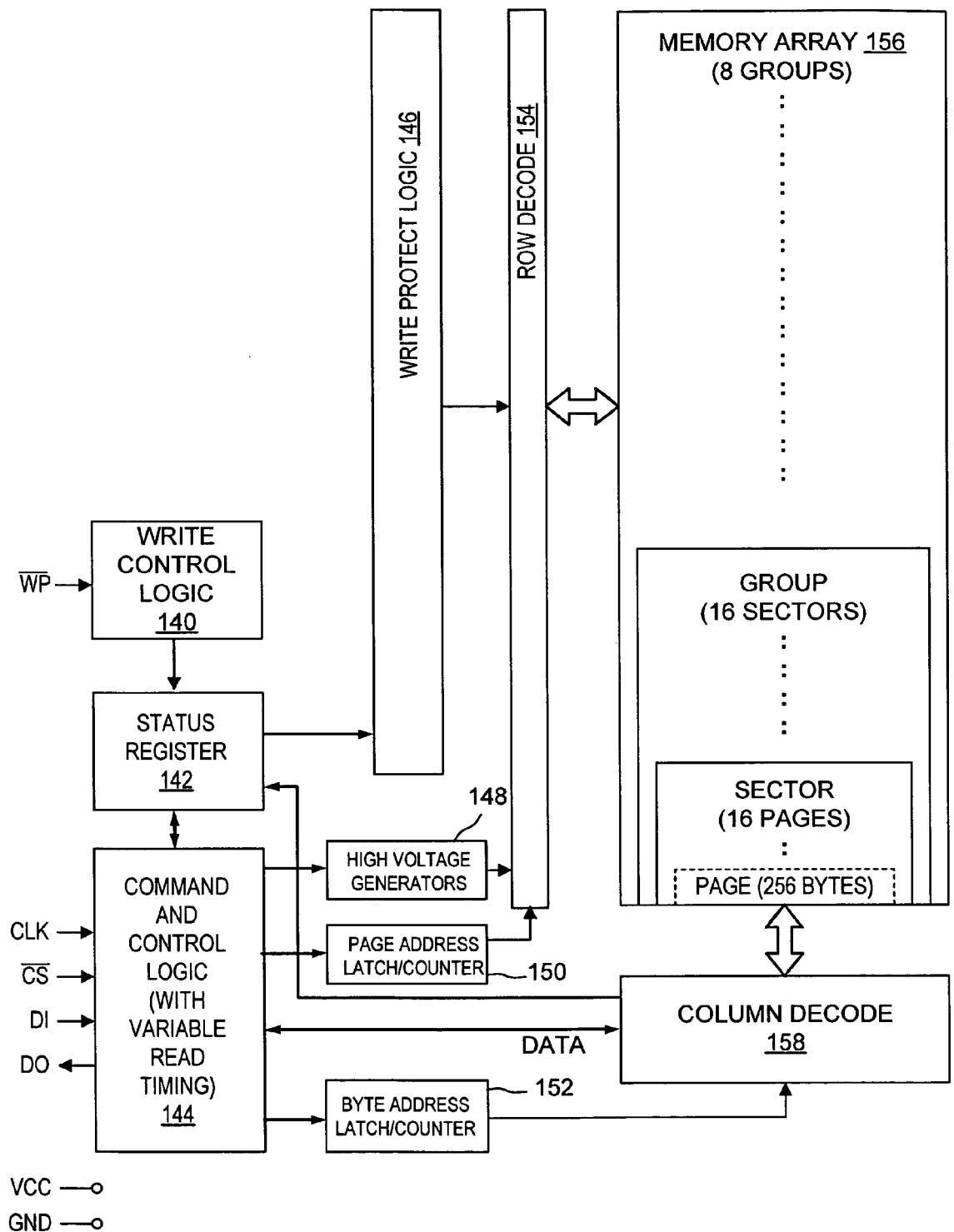
FIG. 5 is a schematic functional block diagram of an illustrative flash memory device suitable for implementing the refresh procedures of FIG. 3 and FIG. 4.

A block diagram of an illustrative 4M-bit serial flash memory device having a refresh procedure using differential read timing is shown FIG. 5. A flash memory array 156 is divided into 128 sectors, each having 4096 bytes (exclusive of redundant bits and specialized data bits, if any). The serial flash memory array 156 is addressed by row decoder 154 and column decoder 158. Write protect logic 146 is responsive to a status register 142 to prevent writing to the serial flash memory array 156 under certain conditions. One of these conditions is when the write protect signal on the input /WP is non-asserted, whereupon write control logic 140 causes the appropriate value to be placed in the status register 142. Command and control logic 144 controls the high voltage generators 148 and page address latch and counter 150, which in turn control the row decoder 154. The command and control logic 144 also controls the byte address latch and counter 152, which in turn controls the column decoder 158. Power supply pins $V_{CC}$ and GND provide power to the circuits of the flash memory device of FIG. 5. The command and control logic 144 also includes a data in pin DI, a data out pin DO, a serial clock input pin CLK, an a chip select input pin /CS. It will be appreciated that while various sector and page sizes, the particular components and their arrangement and interconnections, the bit-serial interface, and other aspects of the device of FIG. 5 are specified, these are presented as examples and considerable variation may be practiced to obtain other flash memory devices. It will also be appreciated that the various peripheral circuits used with a flash memory array to create a nonvolatile memory device are well known in the art, and include address and data buffers, row and column decoders, sense amplifiers, cell-disturb control circuits, high voltage load circuits, over erase protection circuits, programming timer circuits, and on-chip charge pumps. It will also be appreciated that various suitable circuit designs, device designs, and fabrication processes suitable for flash memory devices such as the device of FIG. 5 are well known, and that specific circuits, transistor types and the materials, dimensions, doping concentrations, doses, energy levels, temperatures, drive-in times, ambient conditions, and all other values for the parameters of these processes may well be selected as a matter of design choice or to achieve desired characteristics, as would be understood by one of ordinary skill in the art. As these devices and processes are not specific to the fabrication of the flash memory device of FIG. 5 and are in any event well known in the art, they are not further described herein.

The acquisition and comparison of the values for the bits read in the normal read and the differential read may be done using any suitable circuitry. Any suitable sense amplifiers, registers, comparators, and related logic circuits can be used. One suitable technique include the use of a single sense amplifier per bit to perform both the normal and differential reads, with two registers to store the respective values of the normal and time-altered reads and provide the values to a comparator. Another suitable technique includes the use of two sense amplifiers per bit.

Figure 6:
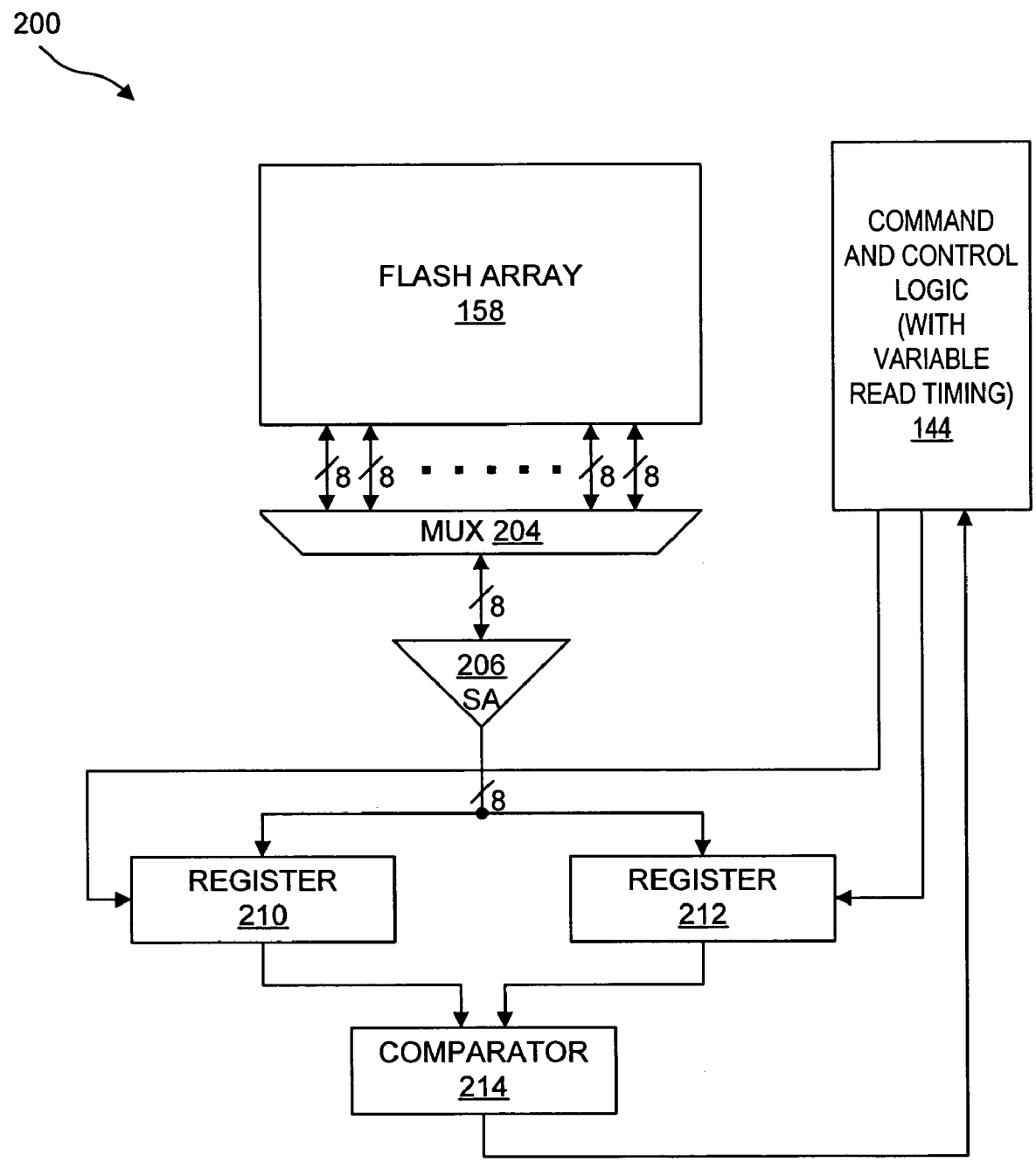
FIG. 6 is a schematic block diagram of one type of illustrative disturb detection circuitry for the flash memory device of FIG. 5.

FIG. 6 is a schematic block diagram showing the principal components of an illustrative disturb detection circuit 200 that uses only one sense amplifier per bit and two registers for storing the results of the normal and time-altered reads. The disturb detection circuit 200 may be implemented as a portion of the column decoder 158 (FIG. 5), and may use components of the column decoder 158 that are used to perform other functions, including conventional functions. It will be appreciated that the path and register sizes are illustrative, and other sizes may be used if desired. Successive bytes of the flash array 158 are selected by multiplexer 204 and sensed by sense amplifiers 206 (one per bit). The sensed data at the output of the sense amplifiers 206 is latched into registers 210 and 212 at different times, under the control of a suitably designed state machine in the command and control logic 144. The results stored in the registers 210 and 212 are transferred in parallel or in series, as desired, to a comparator 214, where they are compared to determine whether any of the read cells need to be reprogrammed. The results of the comparison are furnished to the command and control logic 144, which executes any required reprogramming.

Figure 7:
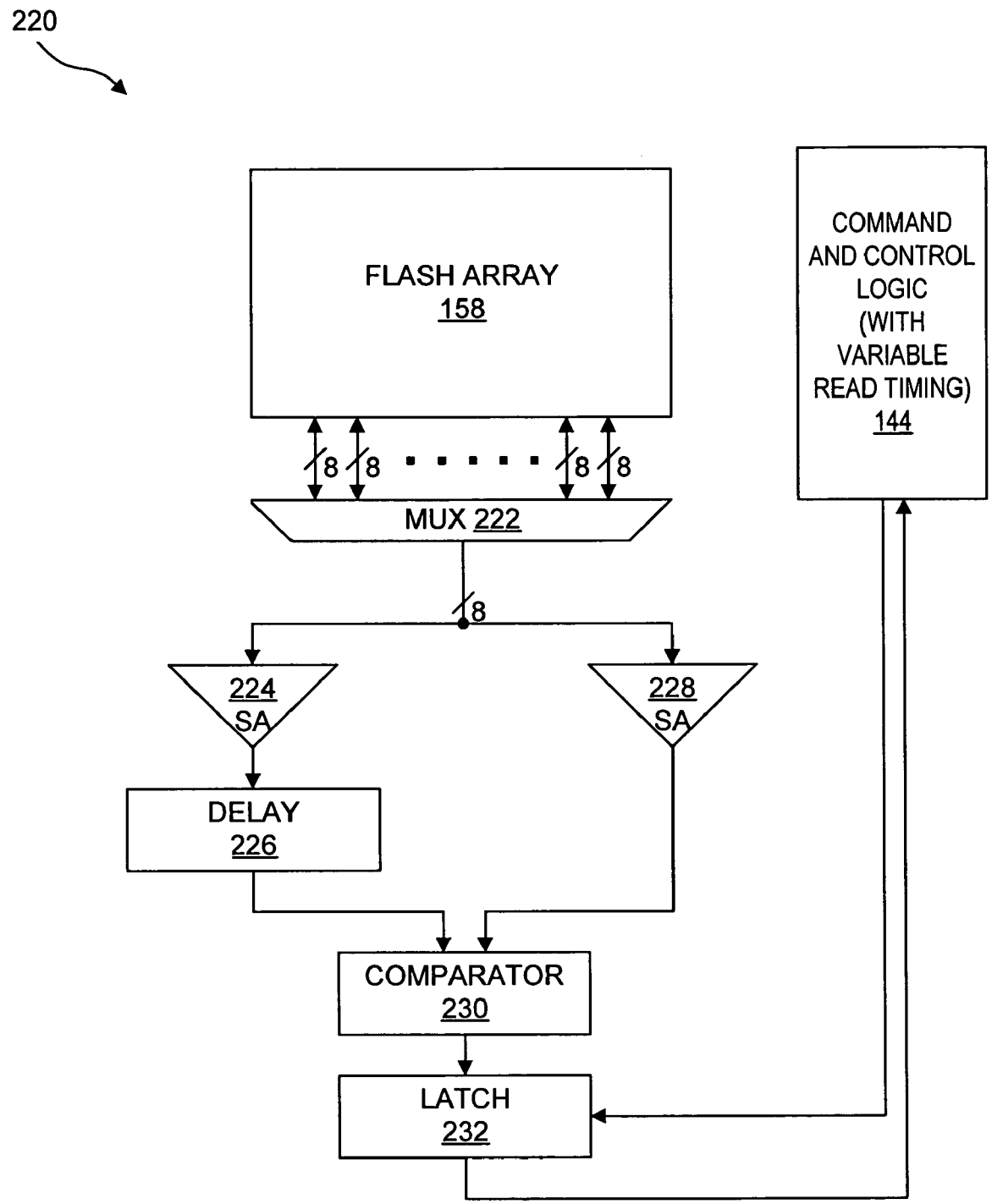
FIG. 7 is a schematic block diagram of another type of illustrative disturb detection circuitry for the flash memory device of FIG. 5.

FIG. 7 is a schematic block diagram showing the principal components of an illustrative disturb detection circuit 220 that uses two sense amplifiers per bit, and for which no registers are required. The disturb detection circuit 220 may be implemented as a portion of the column decoder 158 (FIG. 5), and may use components of the column decoder 158 that are used to perform other functions, including conventional functions. It will be appreciated that the path and register sizes are illustrative, and other sizes may be used if desired. Successive bytes of the flash array 158 are selected by multiplexer 222 and sensed by sense amplifiers 224 and 228 (i.e., two per bit). The output of the sense amplifier 224 is furnished to comparator 230 through a delay 226, while the output of the sense amplifier 228 is directly furnished to the comparator 230. The comparator 230 compares the results of both reads, and the results of the comparison at the output of the comparator 230 are latched by latch 232 at the appropriate time under control of a suitably designed state machine in the command and control logic 144. The results of the comparison are furnished to the command and control logic 144, which executes any required reprogramming.

Figure 8:
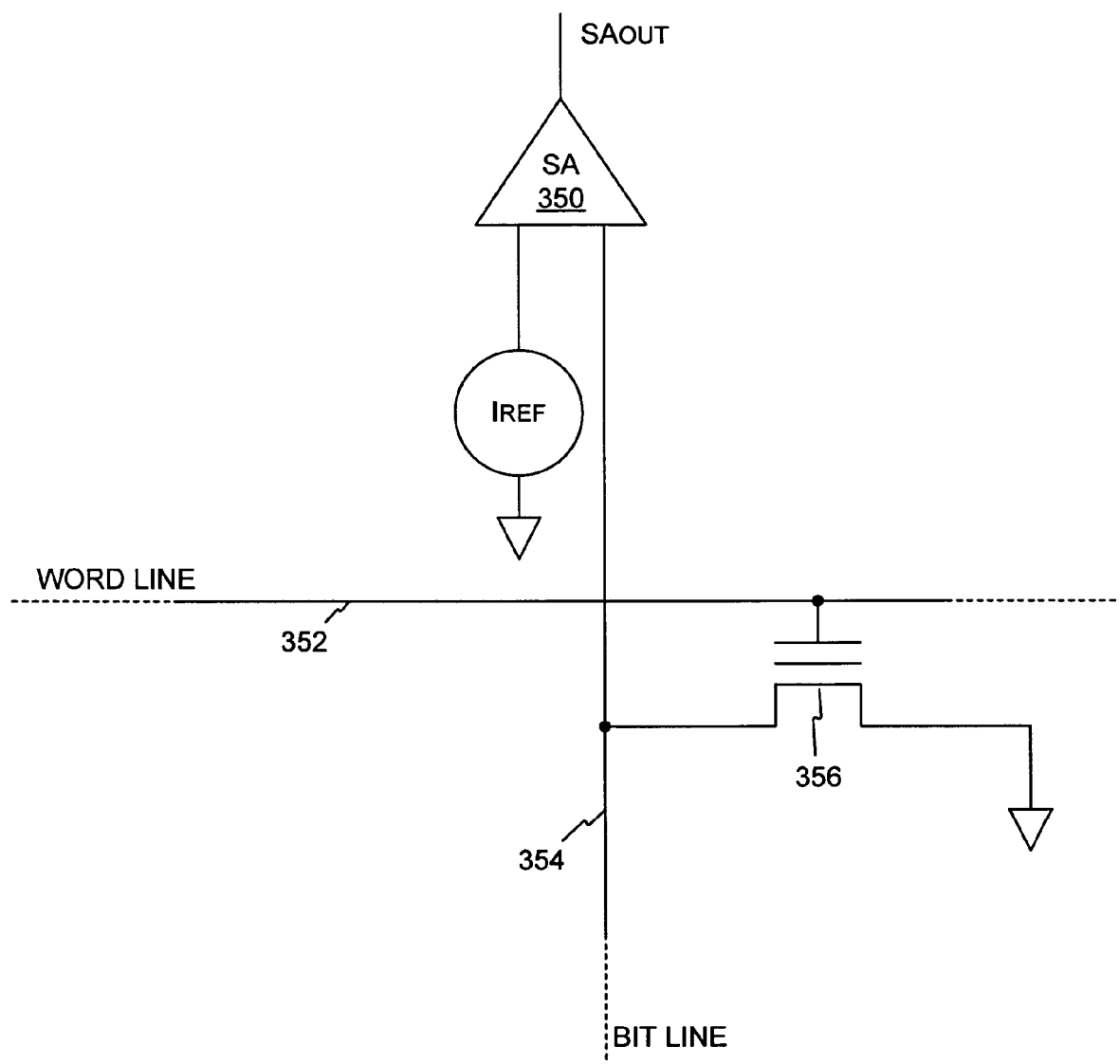
FIG. 8 is a schematic diagram of a static sensing circuit.

The threshold voltage of the memory cells may be sensed using any of a variety of different sensing techniques, including static and dynamic sensing. FIG. 8 is a schematic diagram of a static sensing circuit, in which a sense amplifier 350 compares the drain current of a memory cell 356 with a reference current $I_{REF}$ from a reference cell (not shown). A reference cell is typically a flash cell that has been factory programmed to the reference level during manufacturing. The memory cell 356 is coupled between bit line 354 and word line 352, which supplies the gate voltage of the cell 356.

Figure 9:
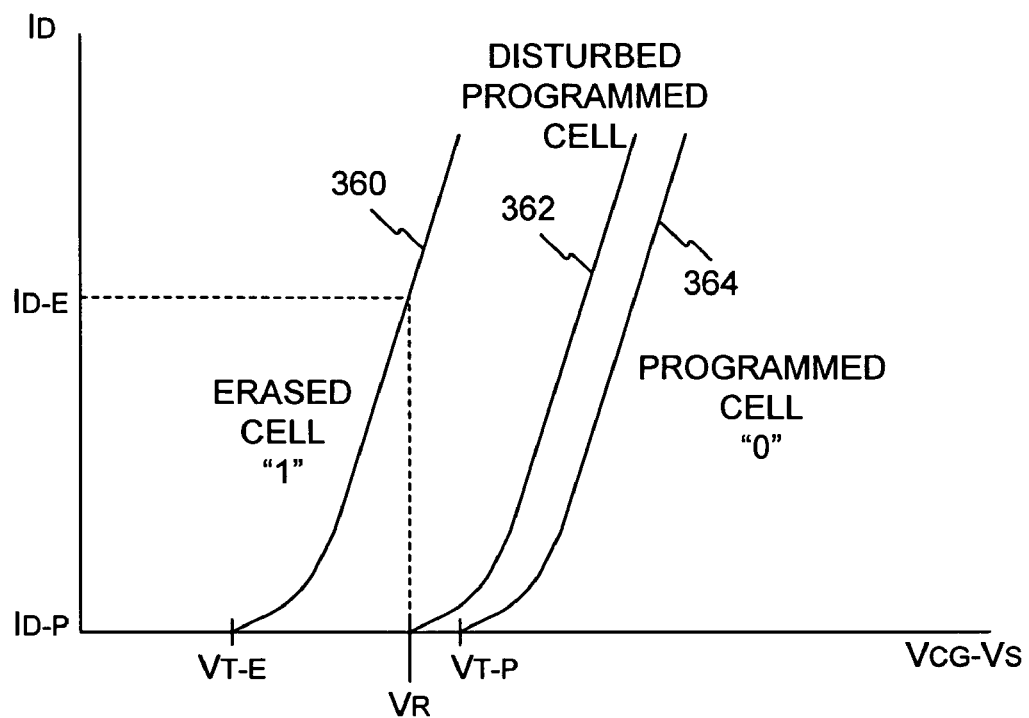
FIG. 9 is a graph showing idealized illustrative current-voltage characteristics for a floating gate flash memory cell.

FIG. 9 is a graph showing idealized illustrative current-voltage characteristics for a floating gate flash memory cell. The charge injected into the floating gate shifts the I-V curves of the memory cell, from curve 360 to curve 364. For a fixed reading bias, the injected charge significantly changes the current level used to sense the cell. The control-gate-to-source voltage is set to $V_R$, a value between the low threshold voltage $V_{T-E}$ of an erased cell and the high threshold voltage $V_{T-P}$ of a programmed cell such that a significantly greater drain current $I_{D-E}$ is drawn by the erased cell than the current $I_{D-P}$ drawn by the programmed cell. For the defined read condition $V_R$, the drain current $I_D$ is $I_{D-E}$ for an erased cell, and $I_{D-P}$ for a programmed cell. The reference current $I_{REF}$ is set between $I_{D-E}$ and $I_{D-P}$ so that the sense amplifier 350 detects whether the current drawn by the memory cell 356 is greater than $I_{REF}$, in which event an erased condition or logical "1" is indicated at its output; or is less than $I_{REF}$, in which event a programmed condition or logical "0" is indicated at its output.

As a programmed cell becomes disturbed, the I-V curve shifts downward, as shown by comparing the shifted curve 362 of a disturbed programmed cell to the curve 314 for a programmed cell. In effect, the threshold voltage of the programmed cell drops and the cell conducts more and more current.

The shifting of the I-V curve may be detected in various ways using static sensing. It will be appreciated that programmed cells with charge loss read more slowly than programmed cells without charge loss. One technique that uses a single sense amplifier per bit (FIG. 6) latches the output of the sense amplifier 206 in the register 210 after a normal sensing interval, and then latches the output of the sense amplifier 206 in the register 212 after a longer-than-normal sensing interval. Because the disturbed programmed cell reads more slowly, the sense amplifier 206 fails to sense the current produced by a disturbed programmed cell in the normal read and therefore senses the disturbed programmed cell as programmed, while the loose read senses the disturbed programmed cell as erased. This difference is detected in comparator 214 and used to initiate the refresh procedure.

Another technique that uses two sense amplifiers per bit (FIG. 7) uses two preferably essentially identical sense amplifiers 224 and 228 to sense the bit line current and supplies the outputs thereof to a comparator 230, but delays the output of the sense amplifier 224. The output of the comparator 230 is latched by the latch 232 upon completion of the normal sensing interval plus the delay interval so that in effect, a normal read from the delayed output of the sense amplifier 224 is compared with a loose read from the output of the sense amplifier 228. Because a disturbed programmed cell reads more slowly, the normal read from the delayed output of the sense amplifier 224 fails to sense the current produced by a disturbed programmed cell and therefore senses the disturbed programmed cell as programmed, while the loose read from the output of the sense amplifier 228 senses the disturbed programmed cell as erased. This difference is detected in comparator 230, latched in the latch 232, and used to initiate the refresh procedure.

Figure 10:
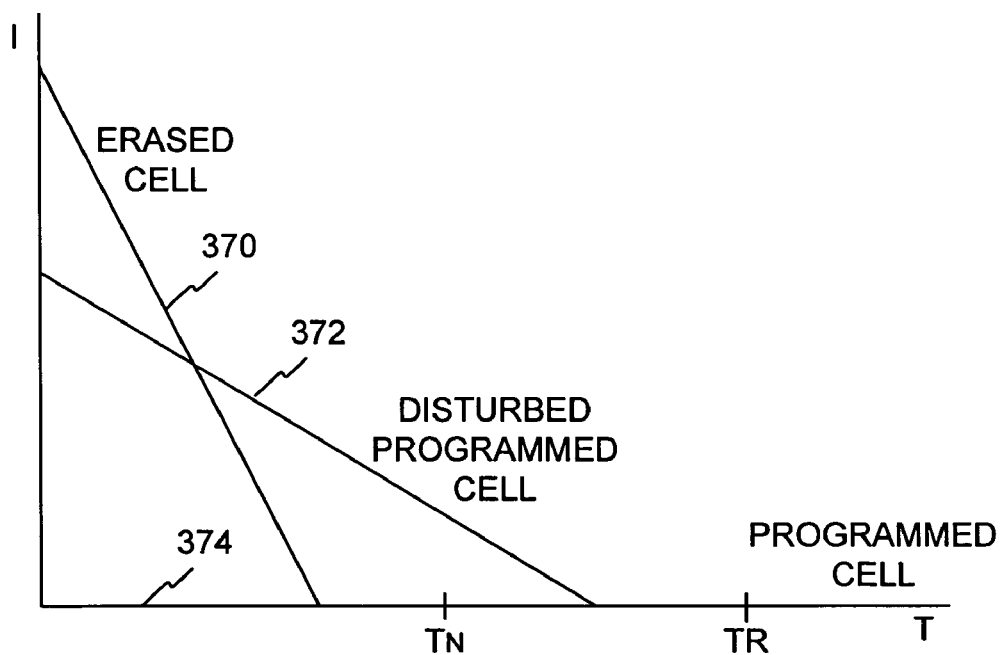
FIG. 10 is a graph showing current-time characteristics for a floating gate flash memory cell.

The shifting of the I-V curve may also be detected using dynamic sensing, in which the bit line is pre charged to $V_{PRE}$, the load is shut off, and bit line level is measured to detect if it is discharged to a certain level at a certain time later. Typically, the dynamic sensing level $V_{T-DYNAMIC}$ is about 0.2 volts or 0.3 volts lower from $V_{PRE}$. FIG. 10 is a graph showing current-time characteristics for a floating gate flash memory cell at a particular $V_{GS}$-$V_S$ and for a particular bit line precharge $V_{PRE}$. As shown by the curve 370, the erased cell discharges the bit line below $V_{T-DYNAMIC}$ very shortly and is read as "1" after normal read timing $T_N$ and relaxed read timing $T_R$. As shown by the curve 374 which lies on the graph axis, the programmed cell is biased not to have any cell current, so it does not discharge the bit line at all and is read as "0" after both of normal read and the relaxed read. As shown by the curve 372, the disturbed programmed cell is biased to have some cell current and discharges the bit line at a slow rate, so the voltage on the bit line does not drop below $V_{T-DYNAMIC}$ after the normal read timing $T_N$ but does drop below $V_{T-DYNAMIC}$ after the relaxed read timing $T_R$. Therefore, the disturbed programmed cell is read as "0" at the normal read timing and "1" at the relaxed timing.

Figure 11:
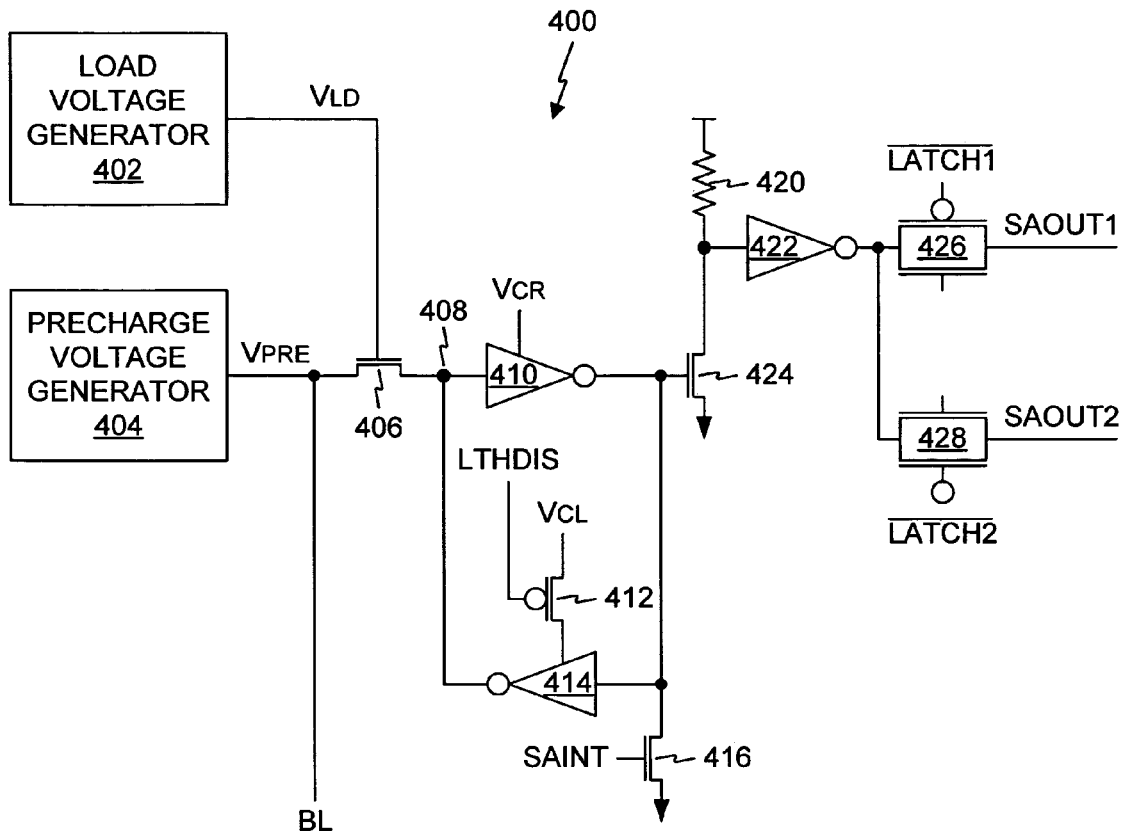
FIG. 11 is a schematic diagram of an illustrative dynamic sensing circuit.
Figure 12:
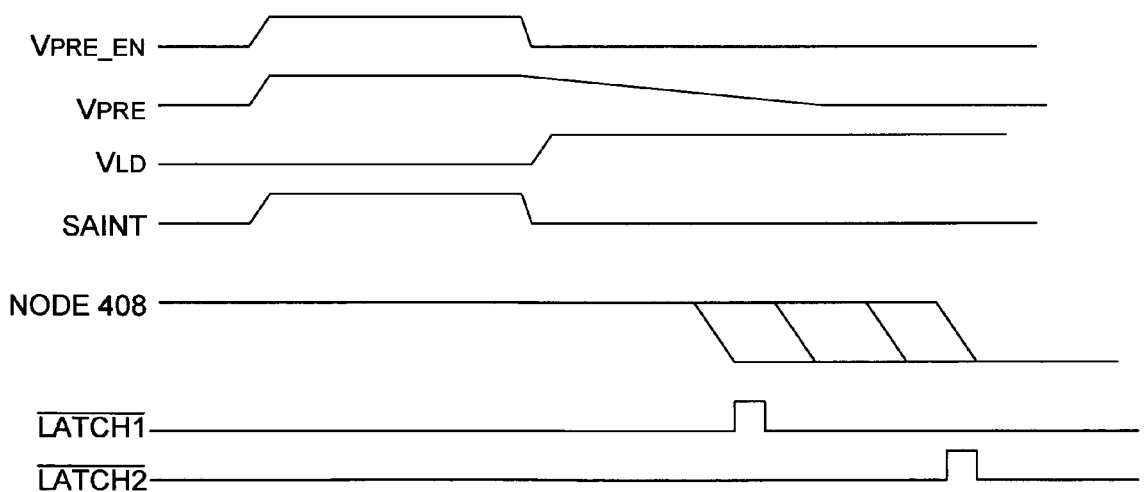
FIG. 12 is a graph of various signals for the circuit of FIG. 11.

FIG. 11 is a schematic diagram of an illustrative dynamic sensing circuit 400, and FIG. 12 is a graph of various signals for the circuit of FIG. 11. Sensing is initiated by precharging the bit line BL. A precharge voltage $V_{PRE}$ of, illustratively, 1.2 volts is generated by the precharge voltage generator 404, and is applied to the bit line BL. At about the same time, node 408 on one side of two cross-coupled inverters 410 and 414 is isolated from the bit line BL and is established at $V_{DD}$ by asserting the sense amplifier initialization signal SAINT at transistor 416. To sense, a load signal $V_{LD}$ is generated by the load voltage generator 402 and applied to a load transistor 406, and the latch disabling signal LTHDIS applied to transistor 412 is disabled so that the voltage $V_{CL}$ is removed from the inverter 414 and node 408 floats. At this time the magnitude of the load signal $V_{LD}$ is, illustratively, about $1.2V+V_T(M1)-0.2V$. Now, depending on the current drawn by the selected memory cell, the bit line BL is discharged toward ground at a particular rate. Should the bit line BL be discharged down to $VLD-V_T(M1)$, there is a sudden charge sharing between the bit line BL and the node 408, which is pulled down quickly.

To detect disturbed cells, two latchings may be performed after each precharge. The output of the inverter 410 is applied to a driver circuit, which includes resister 420, transistor 424, and an inverter 422. The output of the inverter 422 is applied to two latches 426 and 428, which are controlled by respective latch signals /LATCH1 and /LATCH2, and which have respective latched sense amplifier outputs SAOUT1 and SAOUT2. When the memory cell being sensed is an erased cell, which has a low $V_T$, the node 408 is pulled low by the first latching and remains low at the second latching. When the memory cell being sensed is a programmed cell, which has a high $V_T$, the node 508 remains high for both the first latching and second latching. When the memory cell being sensed is a disturbed programmed cell, the node 408 remains high at the first latching, but is pulled low at the second latching.

Figure 13:
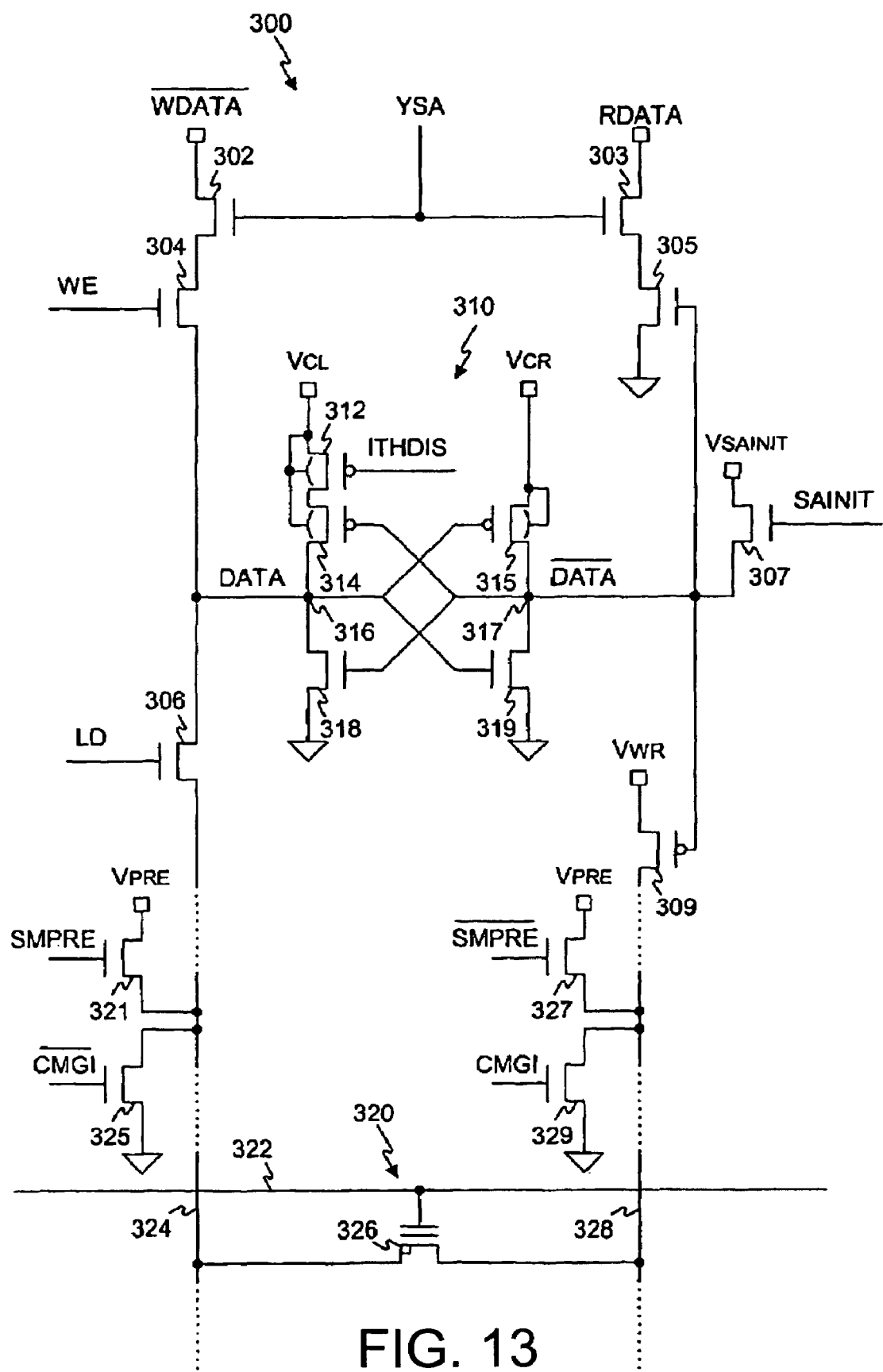
FIG. 13 is a schematic diagram of an illustrative latching sensing circuit.

Another example of a sensing circuit that is suitable for use in the refresh procedures described herein is shown in FIG. 13, which is a reproduction of FIG. 4 of U.S. Pat. No. 6,775,184 issued Aug. 10, 2004 to Park et al, which is incorporated herein in its entirety by reference thereto. The circuit of FIG. 13 may be used as a latching sense amplifier. Two such latching sense amplifiers may be used at the same time, or one may be used along with two conventional latches for sequential reads. In either case, the time is controlled by the duration of the load control signal LD. Consider the normal read duration is from T0 to T1, and a long read duration is from T0 to T2. For an erased cell, the current is sufficiently high to pull down the DATA node for both durations, so that the sense amp reads a 1-1 sequence. For a programmed cell, the current is not sufficient over either duration, so that the sense amp reads a 0-0 sequence. For a disturbed programmed cell, the current over the short duration T0-T1 is not sufficient to pull down the DATA node, but he current over the longer duration T0-T2 is sufficient to pull down the DATA node, so that the sense amp reads a 0-1 sequence. Therefore, a normal-loose read sequence of 1-1 indicates an erased cell, a sequence of 0-0 indicates a programmed cell, and a 0-1 sequence indicates a programmed cell that should be reprogrammed.

The circuit of FIG. 13 may also be used for a tighter read with easier condition for passing erased cells, if the margins are suitable established. For an erased cell, the DATA node is pulled down for both durations, so that the sense amp reads a 1-1 sequence. For a programmed cell, the current is not sufficient over either duration, so that the sense amp reads a 0-0 sequence. For a disturbed programmed cell, the current over the normal duration is sufficient to pull down the DATA node, but the current over the shorter duration is not sufficient to pull down the DATA node, so that the sense amp reads a 1-0 sequence. Therefore, a normal-tight read sequence of 1-1 indicates an erased cell, a sequence of 0-0 indicates a programmed cell, and a 1-0 sequence indicates a programmed cell that should be reprogrammed.

Figure 14:
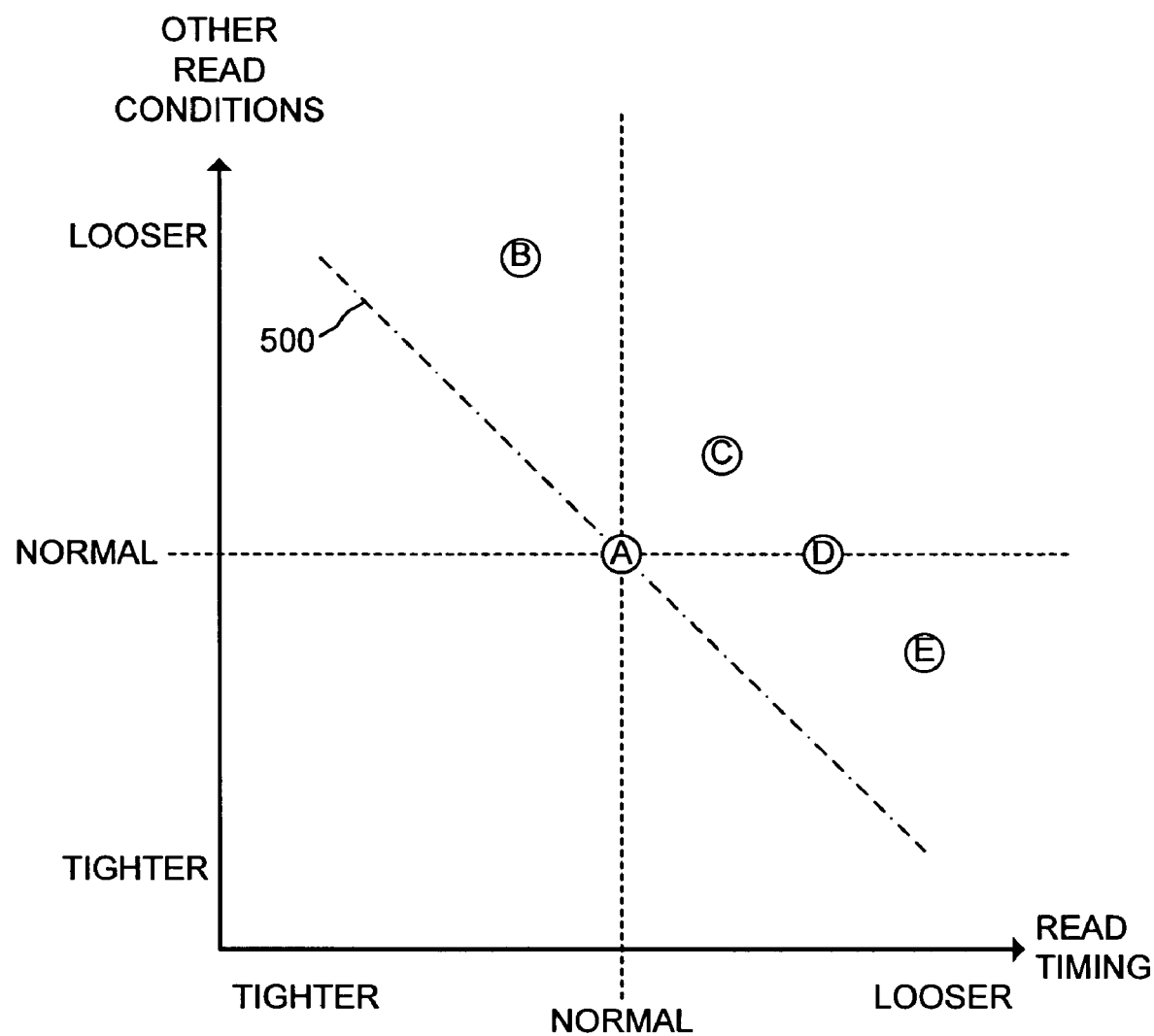
FIG. 14 is a graph showing various conditions suitable for normal and loose reads.

Generally speaking, the task of detecting a disturbed cell before it can be incorrectly read may be achieved by performing one read with normal timing, and the second read with looser timing. This technique of performing a normal read and a loose read is illustrated in FIG. 14, which shows Read A performed with normal read conditions, including normal timing, and Read D performed with looser timing but otherwise normal conditions. A cell that has not been disturbed reads programmed or "0" for both reads, while a cell that has been disturbed reads erased or "1" for the normal read and programmed or "0" for the loose read. When a disturbed condition is detected, the cell is reprogrammed to avoid the possibility of an erroneous future read.

Figure 15:
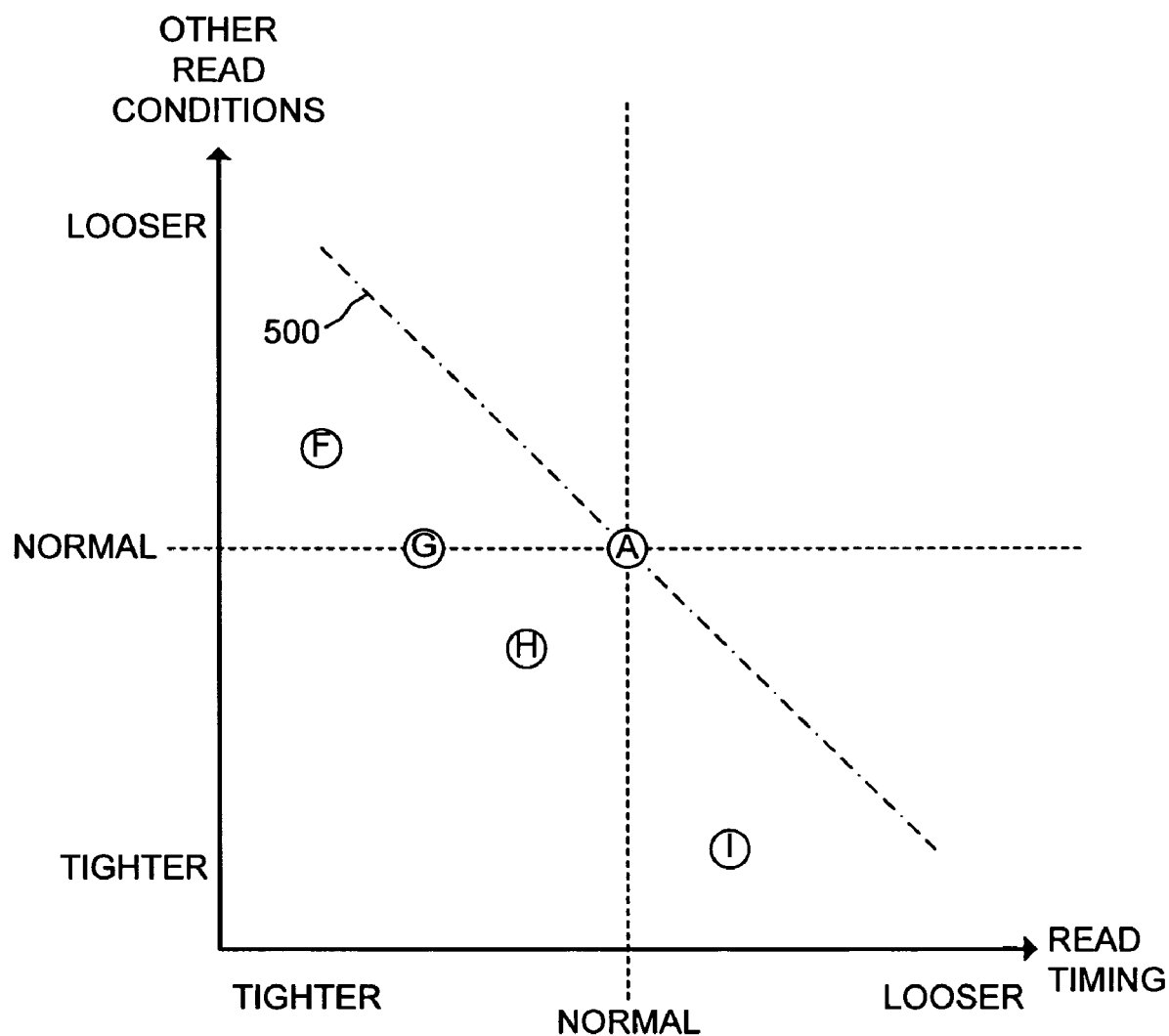
FIG. 15 is a graph showing various conditions suitable for normal and tight reads.

The task of detecting a disturbed cell before it can be incorrectly read may also be performed by performing one read with normal timing, and the second read with tighter timing. This technique of performing a normal read and a tight read is illustrated in FIG. 15, which shows Read A performed with normal conditions, including normal timing, and Read G performed with tighter timing but otherwise normal conditions. A cell that has not been disturbed reads programmed or "0" for both reads, while a cell that has been disturbed reads programmed or "0" for the normal read and erased or "1" for the tight read. When a disturbed condition is detected, the cell is reprogrammed to avoid the possibility of an erroneous future read.

Although using normal read conditions (other than timing) for both the normal read and the time-altered read is preferred because of the simplifications it permits, the tight and loose reads may be performed with one or more of the other read conditions being altered.

With respect to the loose reads shown in FIG. 14, curve 500 represents various read timing and other read conditions for achieving essentially the same sensing. It will be appreciated that the linear shape and position of the curve 500 are illustrative, and that the actual shape and location of the curve 500 depends on design particulars of the memory cells. Reads B, C and E are all effective for performing a loose read. Read C involves looser conditions generally, while Read B involves tighter timing with the other conditions being looser in one or more respects, and Read E involves looser timing with the other conditions being tighter in one or more respects.

With respect to the tight reads shown in FIG. 15, Reads F, H and I are all effective for performing a tight read. Read H involves tighter conditions generally, while Read F involves tighter read timing with the other conditions being looser in one or more respects, and Read I involves looser timing with the other conditions being tighter in one or more respects.

Figure 16:
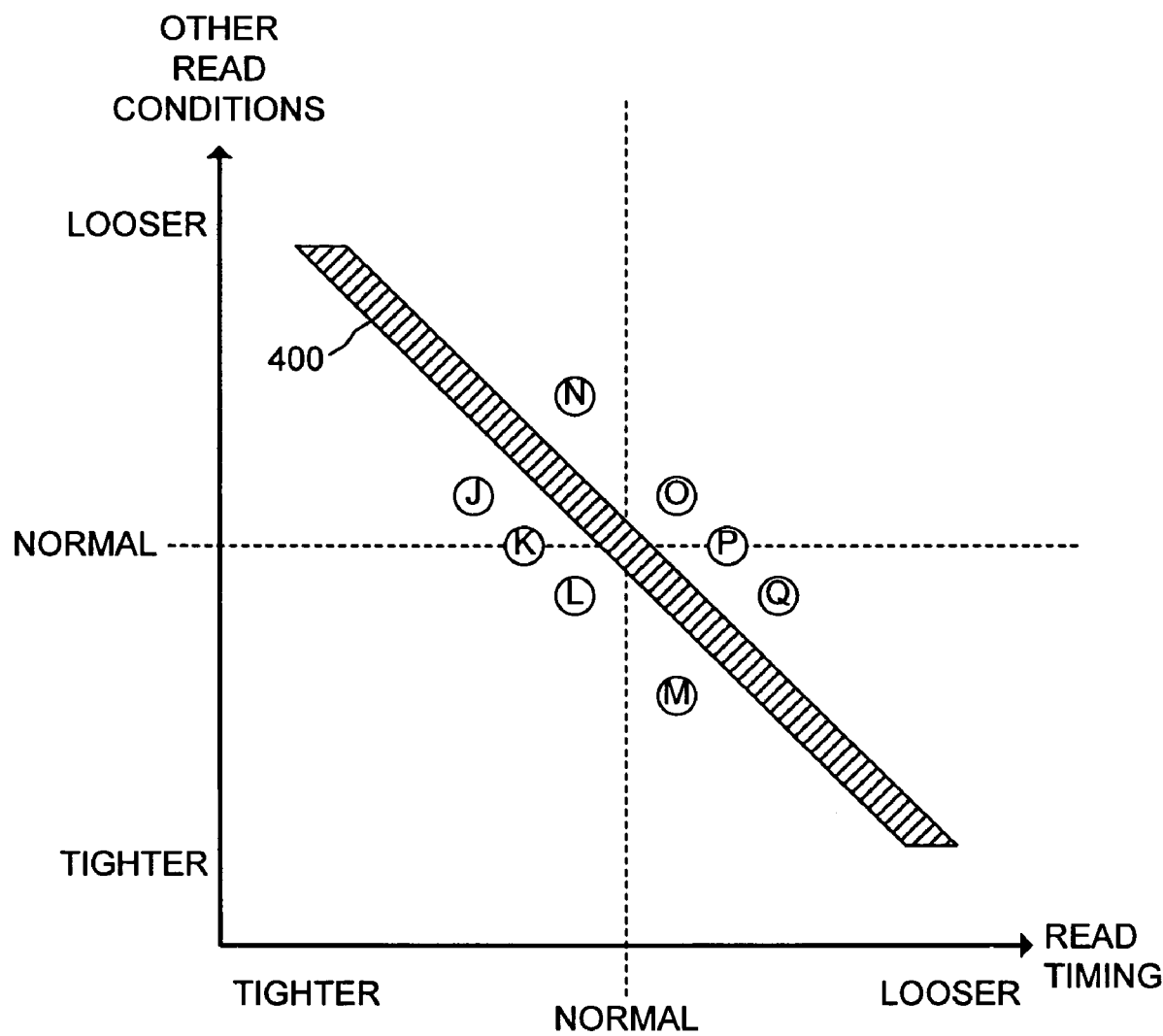
FIG. 16 is a graph showing various conditions suitable for tight and loose reads.

FIG. 16 shows an approach in which the two reads of the cells in the refresh area are performed as one loose read and one tight read, without any normal reads. Region 502 divides the loose and tight read domains. Reads K and P are performed with respectively tighter timing and looser timing, but otherwise with normal conditions. Reads J, L and M are all also effective for performing a tight read. Read L involves tighter conditions generally, while Read J involves tighter timing with the other conditions being looser in one or more respects, and Read M involves looser timing with the other conditions being tighter in one or more respects. Reads N, O and Q are all also effective for performing a loose read. Read O involves looser conditions generally, while Read N involves tighter timing with the other conditions being looser in one or more respects, and Read Q involves looser timing with the other conditions being tighter in one or more respects.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A method of refreshing flash memory having a plurality of floating gate memory cells disposed in groups within respective isolation wells, comprising:
reading the memory cells within a refresh area of a selected one of the groups, wherein first read conditions are used to obtain respective first values, and second read conditions are used to obtain respective second values, and wherein the first and second read conditions respectively include different read timings;
identifying memory cells from among the read memory cells of the reading step for which the respective first and second values in the reading step differ; and
refreshing the identified memory cells.

2. The method of claim 1 wherein:
the first read conditions are normal read conditions; and
the second read conditions are loose read conditions, including at least a loose read timing.

3. The method of claim 1 wherein:
the first read conditions are normal read conditions; and
the second read conditions are tight read conditions, including at least a tight read timing.

4. The method of claim 1 wherein:
the first read conditions are tight read conditions, including at least a tight read timing; and
the second read conditions are loose read conditions, including at least a loose read timing.

5. The method of claim 1 wherein each read is completed in a time about equal to a longest of the read timings of the first read conditions and the second read conditions.

6. The method of claim 1 wherein each read is completed in a time about equal to a sum of the read timings of the first read conditions and the second read conditions.

7. A method of refreshing flash memory having a plurality of floating gate memory cells disposed in groups within respective isolation wells, comprising:
in conjunction with an erase operation or a program operation on a selected set of memory cells in a selected one of the groups, reading at least some of the memory cells in the selected group other than or in addition to the memory cells in the selected set, wherein first read conditions are used to obtain respective first values, and second read conditions are used to obtain respective second values, and wherein the first and second read conditions respectively include different read timings;
identifying memory cells from among the read memory cells of the reading step for which the respective first and second values differ; and
refreshing the identified memory cells.

8. The method of claim 7 wherein:
the reading step is performed immediately following the erase operation or the program operation;
the first read conditions are normal; and
the second read conditions are normal but for an altered read timing.

9. A flash memory device comprising:
a flash memory array having a plurality of row lines, column lines, and floating gate memory cells, the memory cells being coupled to the row lines and the column lines and disposed in groups within respective isolation wells of the array, each of the groups comprising a subset of the word lines;
a row decoder coupled to the word lines;
a column decoder coupled to the bit lines, the column decoder including a plurality of sense amplifiers; and
command and control logic coupled to the row decoder and to the column decoder, the command and control logic comprising a comparator and being responsive to a data change command for:
following a data change operation on memory cells having one or more commonly-biased word lines in a selected one of the groups, reading at least some of the memory cells in the selected group having word lines other than or in addition to the one or more commonly-biased word lines, wherein the sense amplifiers are operable under first read conditions to obtain respective first values, and under second read conditions to obtain respective second values, and wherein the first and second read conditions respectively include different read timings;
applying the first and second values to the comparators for identifying memory cells from among the read memory cells for which the respective first and second values in the reading step differ; and
refreshing the identified memory cells.

10. The flash memory device as in claim 9 wherein the bit lines are sensed by respective single sense amplifiers.

11. The flash memory device as in claim 9 wherein the bit lines are sensed by respective pairs of sense amplifiers.

12. The flash memory device as in claim 9 wherein the sense amplifiers are dynamic sense amplifiers.

13. The flash memory device as in claim 9 wherein the sense amplifiers are static sense amplifiers.

14. The flash memory device as in claim 9 wherein the flash memory cells are hot electron programmable and Fowler-Nordheim erasable.

15. The flash memory device as in claim 9 wherein the data change operation is an erase operation.

16. The flash memory device as in claim 9 wherein the data change operation is a program operation.

17. A flash memory device comprising:
a flash memory array having a plurality of row lines, column lines, and floating gate memory cells, the memory cells being coupled to the row lines and the column lines and disposed in groups within respective isolation wells of the array, each of the groups comprising a subset of the word lines;
a row decoder coupled to the word lines;
a column decoder coupled to the bit lines, the column decoder including a plurality of sense amplifiers; and
command and control logic coupled to the row decoder and to the column decoder, the command and control logic comprising a plurality of comparators and being responsive to an erase or program command for:

performing a data change operation on the memory;

performing a disturb detection operation on the memory immediately following the data change operation;

repeating the data change operation and the disturb detection operation until disturbed memory cells are identified; and refreshing the disturbed memory cells;

wherein each of the data change operations is performed on a respective selected sector of memory cells within a respective selected one of the groups, all other sectors of the selected group being unselected and the memory cells therein being susceptible to erase-program disturb; and wherein each of the disturb detection operations comprises:

reading only the memory cells in the respective non-selected sectors of the respective selected group using normal read timing to obtain respective first values, and altered read timing to obtain respective second values; and applying the first and second values to the comparators for identifying the disturbed memory cells from among the read memory cells of the reading step when the respective first and second values in the reading step differ.

18. The flash memory device as in claim 17 wherein the flash memory array comprises an array of ETOX cells arranged in a NOR architecture, programmed by channel hot electron injection, and erased by Fowler-Nordheim tunneling.

19. The flash memory device as in claim 17 wherein the data change operation is an erase operation.

20. The flash memory device as in claim 17 wherein the data change operation is a program operation.

21. A flash memory device comprising:

a flash memory array having a plurality of row lines, column lines, and floating gate memory cells, the memory cells being coupled to the row lines and the column lines and disposed in groups within respective isolation wells of the array, each of the groups comprising a subset of the word lines;

a row decoder coupled to the word lines;

a column decoder coupled to the bit lines, the column decoder including a plurality of sense amplifiers; and command and control logic coupled to the row decoder and to the column decoder, the command and control logic comprising a plurality of comparators and being responsive to an erase or program command for:

in conjunction with an erase operation or a program operation on a selected set of memory cells in a selected one of the groups, reading at least some of the memory cells in the selected group other than or in addition to the memory cells in the selected set, wherein first read conditions are used to obtain respective first values, and second read conditions are used to obtain respective second values, and wherein the first and second read conditions respectively include different read timings;

applying the first and second values to the comparators to identify memory cells from among the read memory cells for which the respective first and second values differ; and refreshing the identified memory cells.

22. A flash memory comprising:

an array of floating gate flash memory cells programmed by hot electron injection and erased by Fowler-Nordheim tunneling, the memory cells being disposed in a plurality of groups within respective isolation wells of the array;

a row decoder coupled to the array;

a column decoder coupled to the array, the column decoder comprising a disturb detection circuit; and a command and control logic circuit coupled to the disturb detection circuit and comprising:

means for reading memory cells in a refresh area of the array using first read conditions to obtain respective first values, and second read conditions to obtain respective second values, wherein the first and second read conditions respectively include different read timings;

means for identifying memory cells from among the read memory cells for which the respective first and second values differ; and means for refreshing the identified memory cells.

* * * * *